United States Patent
Disegni et al.

(10) Patent No.: US 11,289,158 B2
(45) Date of Patent: Mar. 29, 2022

(54) NON-VOLATILE MEMORY DEVICE INCLUDING A ROW DECODER WITH A PULL-UP STAGE CONTROLLED BY A CURRENT MIRROR

(71) Applicant: STMicroelectronics S.r.l., Agrate Brianza (IT)

(72) Inventors: Fabio Enrico Carlo Disegni, Spino d'adda (IT); Maurizio Francesco Perroni, Messina (IT); Cesare Torti, Pavia (IT); Davide Manfré, Pandino (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/123,518

(22) Filed: Dec. 16, 2020

(65) Prior Publication Data

US 2021/0183442 A1    Jun. 17, 2021

(30) Foreign Application Priority Data

Dec. 16, 2019    (IT) .................. 102019000024135

(51) Int. Cl.
*G11C 13/00*    (2006.01)

(52) U.S. Cl.
CPC ........ *G11C 13/0028* (2013.01); *G11C 13/003* (2013.01); *G11C 13/0004* (2013.01); *G11C 2213/79* (2013.01)

(58) Field of Classification Search
None
See application file for complete search history.

(56) References Cited

U.S. PATENT DOCUMENTS

| 8,737,137 | B1 | 5/2014 | Choy et al. | |
|---|---|---|---|---|
| 2006/0250852 | A1* | 11/2006 | Vimercati | G11C 16/08 365/185.19 |
| 2007/0070688 | A1* | 3/2007 | Kuo | G11C 11/15 365/158 |
| 2010/0235714 | A1* | 9/2010 | Toda | G11C 5/02 714/763 |
| 2013/0286754 | A1 | 10/2013 | Jung et al. | |
| 2019/0206488 | A1 | 7/2019 | Conte | |

* cited by examiner

*Primary Examiner* — J. H. Hur
(74) *Attorney, Agent, or Firm* — Slater Matsil, LLP

(57) ABSTRACT

An embodiment non-volatile memory device includes an array of memory cells, coupled to word lines, and a row decoder including a pull-down stage and a pull-up stage, which includes, for each word line: a corresponding control circuit, which generates a corresponding control signal; and a corresponding pull-up switch circuit, which is controlled via the control signal so as to couple/decouple the word line to/from the supply. The control circuit includes: a current mirror, which injects a current into an internal node; and a series circuit, which couples/decouples the corresponding internal node to/from ground, on the basis of selection/deselection of the corresponding word line so as to cause a decrease/increase in a voltage on the corresponding internal node. Each control signal is a function of the voltage on the corresponding internal node.

20 Claims, 11 Drawing Sheets

NON-VOLATILE MEMORY DEVICE INCLUDING A ROW DECODER WITH A PULL-UP STAGE CONTROLLED BY A CURRENT MIRROR

CROSS-REFERENCE TO RELATED APPLICATIONS

This application claims the benefit of Italian Application No. 102019000024135, filed on Dec. 16, 2019, which application is hereby incorporated herein by reference.

TECHNICAL FIELD

The present invention relates to a non-volatile memory device, which includes a row decoder with a pull-up stage.

BACKGROUND

As is known, various types of non-volatile memories are today available, such as phase-change memories (PCMs), where the characteristics of materials having the property of switching between phases with a different electrical behavior are exploited for storing information. These materials can switch between a disorderly, amorphous, phase and an orderly, crystalline or polycrystalline, phase; different phases are characterized by different values of resistivity and are consequently associated with different values of a datum stored. For instance, the elements of Group VI of the periodic table, such as tellurium (Te), selenium (Se), or antimony (Sb), also known as chalcogenides or chalcogenic materials, can be used for manufacturing phase-change memory cells; in particular, an alloy formed by germanium (Ge), antimony (Sb), and tellurium (Te), known as GST (having the chemical composition $Ge_2Sb_2Te_5$), is currently widely used in such memory cells.

SUMMARY

Phase changes can be obtained by locally increasing the temperature of the cells of chalcogenic material, through resistive electrodes (in general known as "heaters") set in contact with corresponding regions of chalcogenic material.

Access (or selection) devices, for example bipolar or MOS transistors, are connected to the heaters and selectively enable passage of a programming electric current (also known as writing electric current) through them; this electric current, by the Joule effect, generates the heat required for phase change, and in particular for switching from a high-resistivity state (known as RESET state) to a low-resistivity state (the so-called SET state), or vice versa.

During reading, the state of the chalcogenic material is detected by applying a voltage that is sufficiently low as not to cause a sensible heating thereof, and then reading the value of the current that flows in the memory cell through a sense amplifier. Given that the current is proportional to the conductivity of the chalcogenic material, it is possible to determine in which state the material is and consequently determine the datum stored in the memory cell.

This having been said, FIG. 1 shows how, in general, a non-volatile memory device 1 comprises a memory array 2 formed by a plurality of memory cells 3, arranged in rows, or word lines WL, and columns, or bit lines, the latter being also known as "local bit lines LBL".

Each memory cell 3 is formed by a storage element 3a and by an access element 3b, which are connected in series between a respective local bit line LBL and a terminal at the reference potential (for example, ground, GND). A word line WL is defined by the set of all the control terminals of the access elements 3b aligned along a same row.

The storage element 3a includes an element of phase-change material (for example, a chalcogenide, such as GST) and is consequently able to store data in the form of levels of resistance associated with the different phases assumed by the material itself.

The access element 3b is, for example, a bipolar transistor, the base terminal of which is connected to a respective word line WL. In addition, the emitter terminal is connected to a first terminal of the storage element 3a, while the collector terminal is connected to the terminal at the reference potential. A second terminal of the storage element 3a is connected to a corresponding local bit line LBL. The access element 3b is controlled and biased so as to enable, when selected, passage of a reading current, or else of a writing current, through the storage element 3a.

A column decoder 4 and a row decoder 5 enable selection of the memory cells 3, on the basis of address signals received at input (designated as a whole by AS) and more or less complex decoding schemes. The address signals AS can be generated by a control logic CL, which moreover governs the column decoder 4 and the row decoder 5 so as to enable reading and writing (SET and RESET) of the memory cells 3 addressed by the address signals AS. Albeit not illustrated, the control logic CL supplies to the column decoder 4 and to the row decoder 5 also control signals in order to control the aforementioned reading/writing operations.

In particular, the column decoder 4 and the row decoder 5 enable selection of the word lines WL and of the local bit lines LBL each time addressed, and therefore enable biasing at appropriate voltage values of the word lines WL and local bit lines LBL selected.

The column decoder 4 is moreover configured to implement internally two distinct paths towards the local bit lines LBL of the memory array 2 each time selected: a reading path, designed to create selectively a conductive path between each selected local bit line LBL and a reading stage 7, which includes a plurality of sense amplifiers; and a writing path, designed to create selectively a conductive path between each selected local bit line LBL and a writing stage 8 configured to supply the currents required for the writing operations, i.e., for the so-called programming of the memory cells in corresponding logic states, and therefore for storage of information. For this purpose, the column decoder 4 comprises, for each reading and programming path, appropriate selection elements (in particular, controlled transistors), connected so as to implement an address-decoding system, which is typically hierarchical, for selection of the memory cells 3.

In greater detail, various circuit architectures are known that enable implementation of the row decoder 5. Typically, as is shown in FIGS. 2A and 2B, the row decoder 5 comprises a right-hand circuitry 10R and a left-hand circuitry 10L, which are arranged respectively to the right and to the left of the memory array 2. For reasons of simplicity, in FIGS. 2A and 2B the memory array 2 is represented qualitatively, without showing either the memory cells 3 or the local bit lines LBL, and moreover showing only, by way of example, eight word lines WL adjacent to one another (designated, respectively, by WL<0>, ..., WL<7>). In this connection, it is assumed that the eight word lines WL<0>, ..., WL<7> and the memory cells 3 connected thereto form a sub-portion 6 (i.e., a subarray) of the memory array 2, the latter including a plurality of sub-portions 6 (only one of which may be seen in FIGS. 2A and 2B).

In what follows, the row decoder 5 is described with reference to the part coupled to the only sub-portion 6 shown in FIGS. 2A and 2B, except where otherwise specified. Moreover, for brevity, just the left-hand circuitry 10L is described, except where otherwise specified, and it is anticipated that the right-hand circuitry 10R is the same as and symmetrical to the left-hand circuitry 10L, but for the differences described hereinafter. Corresponding components of the left-hand circuitry 10L and of the right-hand circuitry 10R are designated by the same references, but for the final letter, which is "L" for the case of the left-hand circuitry 10L and "R" for the case of the right-hand circuitry 10R, as well as being denoted by the same terms, except for the adjective, which is "left-hand" and "right-hand", respectively.

In detail, the left-hand circuitry 10L comprises a first left-hand pre-selection transistor LY_NL and a second left-hand pre-selection transistor LX_NL, which are N-channel enhancement MOSFETs, which are the same as one another and are connected in series. In particular, the source terminal of the first left-hand pre-selection transistor LY_NL is connected to ground. Moreover, the source terminal of the second left-hand pre-selection transistor LX_NL is connected to the drain terminal of the first left-hand pre-selection transistor LY_NL. The drain terminal of the second left-hand pre-selection transistor LX_NL defines a left-hand common node NL.

The left-hand circuitry 10L further comprises a left decoder branch 12L for each word line WL<0>-WL<7>. In turn, each left decoder branch 12L comprises a respective left-hand bottom cascode transistor 14L and a respective left-hand selection transistor 16L, which are N-channel enhancement MOSFETs and are, for example, the same as the first and second left-hand pre-selection transistors LY_NL, LX_NL. The source terminal of the left-hand selection transistor 16L is connected to the left-hand common node NL, which, as has been said, is associated with the sub-portion 6. Moreover, the drain terminal of the left-hand selection transistor 16L is connected to the source terminal of the left-hand bottom cascode transistor 14L, the drain terminal of which is connected, in turn, to the corresponding word line WL.

As a whole, the left-hand decoding branches 12L of the left-hand circuitry 10L form a left-hand pull-down stage 15L, which, from a circuit standpoint, is the same as the right-hand pull-down stage 15R of the right-hand circuitry 10R and is coupled to the sub-portion 6.

The left-hand circuitry 10L further comprises a respective left-hand pull-up stage 18L, which includes four left-hand pull-up circuits 20L (just two of which may be seen in FIGS. 2A and 2B).

In detail, each left-hand pull-up circuit 20L comprises a respective left-hand top cascode transistor 22L, a respective left-hand biasing transistor 24L, and a respective left-hand deselection transistor 26L, which are P-channel enhancement MOSFETs and are the same as one another. The source terminals of the left-hand biasing transistor 24L and of the left-hand deselection transistor 26L are connected to a supply terminal, which in use is set at a supply voltage $V_{DD}$ (for example, equal to 1.8V in the reading step and to 4.8V in the writing step). The drain terminals of the left-hand biasing transistor 24L and of the left-hand deselection transistor 26L are connected to the source terminal of the left-hand top cascode transistor 22L, the drain terminal of which is connected to a corresponding word line of the word lines WL<0>, WL<2>, WL<4>, and WL<6>.

As is shown in FIG. 4A, the left-hand biasing transistors 24L (only one of which may be seen in FIG. 4A) form a left-hand current mirror 25L, since their gate terminals are connected to the gate terminal of a left-hand mirror transistor 29L (which is a P-channel enhancement MOSFET), the source terminal of which is set at the supply voltage $V_{DD}$, and the gate terminal of which is connected to the drain terminal, which in turn is connected to a left-hand current generator 31L, which generates a current $I_{charge}$, which is mirrored in the left-hand biasing transistors 24L. In addition, on the gate terminals of the left-hand deselection transistors 26L a signal DESELECT_L is present, described hereinafter.

The right-hand pull-up stage 18R of the right-hand circuitry 10R is the same as the left-hand pull-up stage 18L of the left-hand circuitry 10L, but for the fact that the drain terminals of the right-hand top cascode transistors 22R are each connected to a corresponding word line of the word lines WL<1>, WL<3>, WL<5>, and WL<7>. Albeit not shown, the right-hand biasing transistors 24R form a right-hand current mirror (not shown). Moreover, on the gate terminals of the right-hand deselection transistors 26R, a signal DESELECT_R is present, described hereinafter.

The gate terminals of the left-hand bottom cascode transistors 14L of the left-hand circuitry 10L and the gate terminals of the right-hand bottom cascode transistors 14R of the right-hand circuitry 10R are set at a first cascode voltage VCASC (for example, equal to 1.8V in the reading step and to 2.4V in the writing step).

The gate terminals of the left-hand top cascode transistors 22L of the left-hand circuitry 10L and the gate terminals of the right-hand top cascode transistors 22R of the right-hand circuitry 10R are set at a second cascode voltage VCASC_P (equal, for example, to 0V in the reading step and to 2.4V in the writing step).

In practice, the row decoder 5 comprises, for each sub-portion 6 (one of which is visible in FIGS. 2A and 2B) of the memory array 2, a corresponding left-hand pull-down stage 15L of the left-hand circuitry 10L (one of which is visible in FIG. 2A) and a corresponding right-hand pull-down stage 15R (one of which is visible in FIG. 2B) of the right-hand circuitry 10R, which define, respectively, a corresponding left-hand common node NL (one of which is visible in FIG. 2A) and a corresponding right-hand common node NR (one of which is visible in FIG. 2B). Moreover, each left-hand pull-down stage 15L is coupled to a corresponding second left-hand pre-selection transistor LX_NL. Likewise, each right-hand pull-down stage 15R is coupled to a corresponding second right-hand pre-selection transistor LX_NR.

In addition, the sub-portions 6 are gathered in groups of sub-portions 6 (one of which is visible in FIGS. 2A and 2B, designated by 7), each of which includes a pre-set number of sub-portions 6 (for example, eight).

For each group 7, the row decoder 5 comprises a corresponding first left-hand pre-selection transistor LY_NL (one of which is shown in FIG. 2A), the drain terminal of which is connected to the source terminals of the eight second left-hand pre-selection transistors LX_NL (one of which is shown in FIG. 2A), the drain terminals of which are respectively connected to the eight left-hand common nodes NL corresponding to the eight sub-portions 6. Moreover, for each group 7, the row decoder 5 comprises a corresponding first right-hand pre-selection transistor LY_NR (one of which is shown in FIG. 2B), the drain terminal of which is connected to the source terminals of the eight second right-hand pre-selection transistors LX_NR (one of which is shown in FIG. 2B), the drain terminals of which are respectively connected to the eight right-hand common nodes NR corresponding to the eight sub-portions 6.

In practice, the first and second left-hand and right-hand pre-selection transistors enable selection of any sub-portion 6 of the memory array 2, as explained hereinafter. Moreover, the ensemble of the first and second left-hand pre-selection transistors LY_NL, LX_NL and of the left-hand pull-down stages 15L forms a left-hand local selection stage, whereas the ensemble of the first and second right-hand pre-selection transistors LY_NR, LX_NR and of the right-hand pull-down stages 15R forms a right-hand local selection stage.

As shown in FIG. 3, the row decoder 5 further comprises a pre-decoding stage 30, which generates, on the basis of the address signals AS, the signals sLY<7:0>, the signals sLX<7:0>, and the signals PX<7:0>, which enable implementation of a hierarchical structure for selecting the word lines WL. In particular, this example regards the case where the memory array 2 comprises eight groups 7, each of which comprises eight sub-portions 6, each of which, in turn, comprises eight respective word lines WL. It is moreover anticipated that the decoding stage 30 also generates the signals DESELECT_L<7:0> and DESELECT_R<7:0>, described hereinafter. In addition, whereas the signals sLX<7:0>, sLY<7:0>, and PX<7:0> are low-voltage signals, i.e., they have voltages comprised, for example, between 0V and 1V, the signals DESELECT_L and DESELECT_R are high-voltage signals, i.e., they have voltages comprised between 0V and the supply voltage $V_{DD}$, in order to be able to inhibit, as explained hereinafter, the left-hand and right-hand deselection transistors 26L, 26R.

In greater detail, the signals sLY<7:0> and sLX<7:0> enable selection of one of the sixty-four sub-portions 6 of the memory array 2, whereas the signals PX<7:0> enable selection of one of the eight word lines WL of the selected sub-portion 6.

In particular, the decoding stage 30 applies the i-th signal sLY<i> (with i=0, 1, . . . , 7) on the gate terminals of the pair formed by the first left-hand pre-selection transistor LY_NL and by the first right-hand pre-selection transistor LY_NR of the i-th group 7. Moreover, in each of the eight groups 7, the decoding stage 30 applies the j-th signal sLX<j> (with j=0, 1, . . . , 7) on the gate terminals of the pair formed by the j-th second left-hand pre-selection transistor LX_NL and by the j-th second right-hand pre-selection transistor LX_NR. In other words, in each group 7, the j-th signal sLX<j> is supplied to the second pre-selection transistors corresponding to the j-th sub-portion 6. In addition, for each of the sixty-four sub-portions 6, the decoding stage 30 applies the m-th signal PX<m> (with m=0, 1, . . . , 7) on the gate terminals of the left-hand selection transistor 16L of the m-th left-hand decoding branch 12L and of the right-hand selection transistor 16R of the m-th right-hand decoding branch 12R; in other words, in each sub-portion 6, the m-th signal PX<m> is supplied to the selection transistors corresponding to the m-th word line WL<m>.

In use, the pre-decoding stage 30 activates (by sending it to the logic value '1', instead of to '0') just one of the eight signals sLY<7:0> at a time, as well as just one of the eight signals sLX<7:0> at a time and just one of the eight signals PX<7:0> at a time. In this way, designating by sLY<i*>, sLX<j*>, and PX<m*> just the active signals sLY, sLX and PX, respectively, we find that:

of the first left-hand and right-hand pre-selection transistors LY_NL, LY_NR, only the two transistors that receive on the gate terminals thereof the signal sLY<i*> are in conduction, this being equivalent to selecting the i*-th group 7;

of the second left-hand and right-hand pre-selection transistors LX_NL, LX_NR, only the two transistors that receive on the gate terminals thereof the signal sLX<j*> are in conduction, this being equivalent to selecting, within the i*-th group 7, the j*-th sub-portion 6, which is connected, through the respective left-hand and right-hand pull-down stages 15L, 15R, to the pair of transistors;

of the left-hand selection transistors 16L of the left-hand pull-down stage 15L corresponding to the j*-th sub-portion 6 of the i*-th group 7, only the left-hand selection transistor 16L that receives on the gate terminal thereof the signal PX<m*> is in conduction, together with the corresponding left-hand bottom cascode transistor 14L; and of the right-hand selection transistors 16R of the right-hand pull-down stage 15R corresponding to the j*-th sub-portion 6 of the i*-th group 7, only the right-hand selection transistor 16R that receives on the gate terminal thereof the signal PX<m*> is in conduction, together with the corresponding right-hand bottom cascode transistor 14R.

In practice, the signals sLY<i*>, sLX<j*>, and PX<m*> enable selection of the m*-th word line WL<m*> of the j*-th sub-portion 6 of the i*-th group 7, which is connected to ground by a first conductive path and a second conductive path arranged symmetrically at the ends of the word line WL<m*>. The first conductive path acts as discharge circuit and includes a plurality of switches connected in series; in particular, the first conductive path includes: the first left-hand pre-selection transistor LY_NL, which receives on the gate terminal thereof the signal sLY<i*>; the second left-hand pre-selection transistor LX_NL, which is coupled to the first left-hand pre-selection transistor LY_NL and receives on the gate terminal thereof the signal sLX<j*>; and the left-hand selection transistor 16L of the left-hand pull-down stage 15L corresponding to the selected sub-portion 6, which receives on the gate terminal thereof the signal PX<m*>, in addition to the corresponding left-hand bottom cascode transistor 14L. Likewise, the second conductive path acts as a further discharge circuit and includes a plurality of switches connected in series; in particular, the second conductive path includes: the first right-hand pre-selection transistor LY_NR, which receives on the gate terminal thereof the signal sLY<i*>; the second right-hand pre-selection transistor LX_NR, which is coupled to the first right-hand pre-selection transistor LY_NR and receives on the gate terminal thereof the signal sLX<j*>; and the right-hand selection transistor 16R of the right-hand pull-down stage 15R corresponding to the selected sub-portion 6, which receives on the gate terminal thereof the signal PX<m*>, in addition to the corresponding right-hand bottom cascode transistor 14R.

The first and second conductive paths therefore enable connection to ground of the selected word line WL, in a symmetrical way. In this way, the differences in voltage to which the base terminals of the bipolar transistors that form the access elements 3b coupled to the selected word line WL are inevitably subject are reduced, on account of the current that flows in the selected word line WL. Instead, the non-selected word lines WL are disconnected from ground and, as explained hereinafter, are set at a voltage that corresponds to a high logic level.

An example of selection of the word line WL<0> of the j*-th sub-portion 6 of the i*-th group 7 is shown in FIG. 4A, where it is highlighted how, in the left-hand pull-up circuit 20L coupled to the word line WL<0>, the left-hand deselection transistor 26L receives on the gate terminal thereof the signal DESELECT_L<i*>, which has a high logic value, so that within the left-hand deselection transistor 26L no current flows. It is therefore found that the current $I_{charge}$ flows in the left-hand biasing transistor 24L, in the corresponding left-hand top cascode transistor 22L, in the selection transistor 16L the gate terminal of which receives the signal PX<0>, and in the corresponding left-hand bottom cascode transistor 14L, as well as in the first left-hand pre-selection transistor LY_NL that receives the signal sLY<i*> and in the second left-hand pre-selection transistor LX_NL, which is coupled to the latter and receives the signal sLX<j*>; in this way, the word line WL<0> is at a low-voltage, since it is connected to ground.

In greater detail, albeit not visible in FIG. 4A, the gate terminals of all the left-hand deselection transistors 26L of the left-hand pull-up circuits 20L of the i-th group 7 receive a same signal DESELECT_L<i>, which coincides with the signal DESELECT_R<i> present on the gate terminals of the right-hand deselection transistors 26R of the right-hand pull-up circuits 20R of the group 7. Moreover, with reference to the signals sLY<i> and DESELECT_L<i> (the latter being equal to DESELECT_R<i>), these assume a same logic value. Consequently, in the case of selection of the m*-th word line WL<m*> of the j*-th sub-portion 6 of the i*-th group 7, the word lines of the j*-th sub-portion 6 of the i*-th group 7 different from the m*-th word line WL<m*> are deselected because they are at a high-voltage on account of inhibition of the corresponding left-hand and right-hand selection transistors 16L, 16R and on account of their coupling to the supply terminal through the corresponding biasing transistor (either the left-hand one 24L or the right-hand one 24R, according to whether it is an even word line or an odd word line).

In the case (shown, for example, in FIG. 4B) of an i-th non-selected group 7, the signal sLY<i> is low, so as to inhibit the corresponding first left-hand pre-selection transistor LY_NL and the corresponding first right-hand pre-selection transistor LY_NR. In addition, also the signal DESELECT_L<i'> is low, so as to maintain the left-hand deselection transistors 26L coupled to the i-th group 7 above threshold, thus raising the voltage present on the odd word lines connected thereto. Since also the signal DESELECT_R<i'> is low, also the right-hand deselection transistors 26R coupled to the i-th group 7 are above threshold, thus raising the voltage present on the even word lines connected thereto.

For instance, assuming that the word line WL<0> of the j*-th sub-portion 6 of the i*-th group 7 has been selected, FIG. 4B shows the word line WL<0> of the j*-th sub-portion 6 of the i-th group 7. It may be noted how the word line WL<0> has a high-voltage, and is therefore deselected, since, even though the corresponding left-hand selection transistor 16L is above threshold, the first conductive path (and likewise, albeit not visible in FIG. 4B, also the second conductive path) is interrupted on account of inhibition of the aforementioned first left-hand pre-selection transistor LY_NL. Similar considerations apply in the case (not shown) of any deselected j-th sub-portion 6 of the (selected) i*-th group 7, the corresponding second left-hand and right-hand pre-selection transistors LX_NL, LX_NR of which are inhibited.

In practice, the pull-up stage 18R of the right-hand circuitry 10R and the pull-up stage 18L of the left-hand circuitry 10L can be controlled so as to raise the voltage of the selected word line. Furthermore, the pull-up stage 18R of the right-hand circuitry 10R and the pull-up stage 18L of the left-hand circuitry 10L form a pull-up macrostage, which is distributed in part on the right, and in part on the left, of the memory array 2.

The Italian patent application No. 102019000021165, entitled "Non-volatile memory device with an asymmetrical row decoder and method for selecting word lines" filed on Nov. 14, 2019 in the name of the present applicant describes a variant in which the pull-up circuits are centralized, i.e., they are arranged in an asymmetrical way, as described hereinafter.

In detail, FIG. 5 shows a non-volatile memory device 100, which includes, albeit in a way not shown, memory cells of the same type as those shown in FIG. 1. Moreover, the non-volatile memory device 100 includes a first right-hand memory array 102A_R and a second right-hand memory array 102B_R and a first left-hand memory array 102A_L and a second left-hand memory array 102B_L, each of which is, for example, the same as the memory array 2 described with reference to FIG. 1. The first and second right-hand memory arrays 102A_R, 102B_R and the first and second left-hand memory arrays 102A_L, 102B_L are arranged aligned horizontally.

The non-volatile memory device 100 further comprises a row decoder 105, which in turn comprises a central deselection stage 118, which is arranged so that the first and second right-hand memory arrays 102A_R, 102B_R are arranged on the right of the central deselection stage 118, the first right-hand memory array 102A_R being interposed between the central deselection stage 118 and the second right-hand memory array 102B_R. Likewise, the first and second left-hand memory arrays 102A_L, 102B_L are arranged on the left of the central deselection stage 118, the first left-hand memory array 102A_L being interposed between the central deselection stage 118 and the second left-hand memory array 102B_L.

For each memory array, the row decoder 105 comprises a right-hand local selection stage 110R and a left-hand local selection stage 110L, which extend, respectively, to the right and to the left of the memory array. The left-hand local selection stage 110L corresponding to the first left-hand memory array 102A_L is arranged on the right of the right-hand local selection stage 110R corresponding to the second left-hand memory array 102B_L. The right-hand local selection stage 110R corresponding to the first right-hand memory array 102A_R is arranged on the left of the left-hand local selection stage 110L corresponding to the second right-hand memory array 102B_R.

The first and second right-hand memory arrays 102A_R, 102B_R and the first and second left-hand memory arrays 102A_L, 102B_L are, for example, the same as one another. Moreover, it is assumed that each one of the first and second right-hand memory arrays 102A_R, 102B_R and the first and second left-hand memory arrays 102A_L, 102B_L comprises a same number $N_{group}$ (for example, equal to eight) of groups (designated by 107, FIG. 7) of sub-portions (designated by 106, FIG. 7), referred to hereinafter as subarrays 106. It is moreover assumed that each group 107 comprises a number $N_{array}$, for example equal to eight, of subarrays 106, each of which comprises, for example, one thousand and twenty-four word lines. Moreover, considering any subarray 106 of any one of the first and second right-hand memory arrays 102A_R, 102B_R and the first and second left-hand memory arrays 102A_L, 102B_L, the corresponding right-hand local selection stage 110R and left-hand local selection stage 110L comprise, respectively, a corresponding right-hand pull-down stage (designated by 115R, one of which is shown in FIG. 7) and a corresponding left-hand pull-down stage (designated by 115L, one of which is shown in FIG. 7), which are, for example, of the type shown in FIG. 2A and are coupled to the subarray 106 in the way shown in FIG. 2A. The components of the right-hand pull-down stage 115R and left-hand pull-down stage 115L are designated in what follows by the same reference numbers as the ones used in FIG. 2B, increased by one hundred, except for the left-hand common node and the right-hand common node, which are denoted once again by NL and NR, respectively. Moreover, considering any subarray 106 of any one of the first and second right-hand memory arrays 102A_R, 102B_R and the first and second left-hand memory arrays 102A_L, 102B_L, the corresponding right-hand local selection stage 110R comprises a number of first right-hand pre-selection transistors LY_NR equal to the number $N_{group}$ of groups 107 and, for each of the first right-hand pre-selection transistors LY_NR, a number of second right-hand selection transistors LX_NR equal to the number $N_{array}$ of subarrays 106. The connections between the right-hand pull-down stages 115R and the first and second right-hand pre-selection transistors LY_NR, LX_NR are the same as what has been described with reference to FIG. 2B. Likewise, considering any subarray 106 of any one of the first and second right-hand memory arrays 102A_R, 102B__R and of the first and second left-hand memory arrays 102A_L, 102B_L, the corresponding left-hand local selection stage 110L comprises a number of first left-hand pre-selection transistors LY_NL equal to the number $N_{group}$ of groups 107 and, for each of the first left-hand pre-selection transistors LY_NL, a number of second left-hand selection transistors LX_NL equal to the number $N_{array}$ of subarrays 106. The connections between the left-hand pull-down stages 115L and the first and second left-hand pre-selection transistors LY_NL, LX_NL are the same as what has been described with reference to FIG. 2A.

In addition, it is assumed that the first and second right-hand memory arrays 102A_R, 102B_R are traversed by, and therefore share between them, a plurality of word lines, referred to hereinafter as right-hand word lines WL_dx. It is moreover assumed that the first and second left-hand memory arrays 102A_L, 102B_L are traversed by, and therefore share between them, a plurality of further word lines, referred to hereinafter as left-hand word lines WL_sx. The right-hand word lines and the left-hand word lines extend horizontally and are stacked vertically.

As shown in FIG. 6, for each sub-portion 106, the central deselection stage 118 comprises one thousand and twenty-four corresponding central pull-up circuits 120 (just two of which may be seen in FIG. 6), each of which is coupled to a corresponding pair formed by a left-hand word line WL_sx and by a corresponding right-hand word line WL_dx.

For instance, with reference to the n-th central pull-up circuit 120, it is coupled to the left-hand word line WL_sx<n> and to the right-hand word line WL_dx<n>, which extend to the left and to the right of the central pull-up circuit 120, respectively.

In greater detail, each central pull-up circuit 120 comprises a respective left-hand top cascode transistor 122L and a respective right-hand top cascode transistor 122R, which are P-channel enhancement MOSFETs and are the same as one another; in addition, each central pull-up circuit 120 comprises a respective left-hand deselection transistor 126L and a respective right-hand deselection transistor 126R, which are P-channel enhancement MOSFETs and are the same as the right-hand and left-hand top cascode transistors 122R, 122L. In addition, each central pull-up circuit 120 comprises a respective control circuit 199.

The gate terminals of the left-hand top cascode transistor 122L and of the right-hand top cascode transistor 122R are set at the second cascode voltage VCASC_P. The drain terminals of the left-hand top cascode transistor 122L and of the right-hand top cascode transistor 122R are connected to the left-hand word line WL_sx<n> and to the right-hand word line WL_dx<n>, respectively. The drain terminals of the left-hand deselection transistor 126L and of the right-hand deselection transistor 126R are connected to the source terminals of the left-hand top cascode transistor 122L and of the right-hand top cascode transistor 122R, respectively. Moreover, the source terminals of the left-hand deselection transistor 126L and of the right-hand deselection transistor 126R are connected to the supply voltage $V_{DD}$.

In use, each control circuit 199 receives from the pre-decoding stage 30 the signals sLX, sLY, and PX (generated as described with reference to FIGS. 2A and 2B; the pre-decoding stage 30 does not generate, instead, the signals DESELECT). In this connection, considering any subarray 106 of any one of the first and second right-hand memory arrays 102A_R, 102B_R and of the first and second left-hand memory arrays 102A_L, 102B_L, the corresponding right-hand and left-hand local selection stages 110R, 110L are driven by the decoding stage 30 in the same way as described with reference to FIGS. 2A and 2B. Moreover, the right-hand and left-hand local selection stages 110R, 110L of the first and second right-hand memory arrays 102A_R, 102B_R and of the first and second left-hand memory arrays 102A_L, 102B_L receive the same signals sLX, sLY, and PX.

In addition, each control circuit 199 generates a respective signal Vcomm<n>, which is applied to the gate terminals of the respective left-hand deselection transistor 126L and of the respective right-hand deselection transistor 126R. In other words, each central pull-up circuit 120 forms a pair of pull-up switching circuits, which control a corresponding left-hand word line WL_sx and a corresponding right-hand word line WL_dx, respectively, which are driven in the same way.

In what follows, considering the symmetry of the non-volatile memory device 100 and for reasons of simplicity, selection/deselection of just the right-hand word lines WL_dx is described, with reference to what is shown in FIG. 7. Moreover, except where otherwise specified, in what follows reference is made to a generic subarray 106 of a generic group 107 of the first right-hand memory array 102A_R, which is, for example, coupled to the first left-hand and right-hand pre-selection transistors LY_NL, LY_NR driven by the signal sLY<0> and to the second left-hand and right-hand pre-selection transistors LX_NL, LX_NR driven by the signal sLX<0>. Once again with reference to FIG. 7, designated, respectively, therein by $E_{sx}$ and $E_{dx}$ are two points arranged at the ends of the portion of each right-hand word line WL_dx that traverses the first right-hand memory array 102A_R, respectively connected to which are the corresponding left-hand decoding branch 112L of the left-hand pull-down stage 115L (in particular, the drain terminal of the corresponding left-hand bottom cascode transistor 114L) and the corresponding right-hand decoding branch 112R of the right-hand pull-down stage 115R (in particular, the drain terminal of the corresponding right-hand bottom cascode transistor 114R). In what follows, the points $E_{sx}$ and $E_{dx}$ are referred to, respectively, as left-hand point $E_{sx}$ and right-hand point $E_{dx}$. Moreover, the left-hand point $E_{sx}$ is closer to the central deselection stage 118 than the right-hand point $E_{dx}$.

In practice, considering a portion of right-hand word line WL_dx comprised between the respective left-hand point $E_{sx}$ and the respective right-hand point $E_{dx}$, the corresponding right-hand decoding branch 112R and the corresponding left-hand decoding branch 112L are arranged in a symmetrical way with respect to the portion and function as pull-down switching circuits, which enable coupling/decoupling, respectively, of the right-hand point $E_{dx}$ to/from the right-hand common node NR and of the left-hand point $E_{sx}$ to/from the left-hand common node NL. In addition, the left-hand point $E_{sx}$ is connected to the drain terminal of the right-hand top cascode transistor 122R of the corresponding central pull-up circuit 120.

Albeit not shown in detail, the same considerations apply to the left-hand word lines WL_sx and the corresponding couplings with the left-hand decoding branches 112L of the left-hand pull-down stages 115L and the right-hand decoding branches 115R of the right-hand pull-down stages 115R. In this case, with reference, for example, to the first left-hand memory array 102A_L, if denoted as right-hand point $E_{dx}$ and left-hand point $E_{sx}$ are the ends (respectively close to and further away from the central deselection stage 118, as may be seen in FIG. 6, where for simplicity of representation the pull-down stages are not represented) of the portion of each left-hand word line WL_sx that traverses the first left-hand memory array 102A_L, the right-hand point $E_{dx}$ is connected to the drain terminal of the left-hand top cascode transistor 122L of the corresponding central pull-up circuit 120.

For completeness, FIG. 6 moreover shows, for each right-hand word line WL_dx, a corresponding additional left-hand point $E_{sx}'$ and a corresponding additional right-hand point $E_{dx}'$, which delimit the portion of the right-hand word line WL_dx that traverses the second right-hand memory array 102B_R and are respectively coupled to the corresponding left-hand decoding branch 112L (not shown in FIG. 6) and to the corresponding right-hand decoding branch 112R (not shown in FIG. 6). The additional left-hand point $E_{sx}'$ electrically coincides with the right-hand point $E_{dx}$ of the right-hand word line WL_dx.

Once again with reference to the control circuit 199 that drives the n-th right-hand word line WL_dx<n> of a generic subarray 106 of a generic group 107 of the first right-hand memory array 102A_R, this sets the signal Vcomm<n> at a high logic value (equal, for example, to 1.8V in the reading step and to 4.8V in the writing step) if the pre-decoding stage 30 indicates, through the signals sLX<7:0>, sLY<7:0> and PX<7:0>, selection of the n-th right-hand word line WL_dx<n>. In this way, the right-hand deselection transistor 126R is inhibited, and the n-th right-hand word line WL_dx<n> is decoupled from the supply node $V_{DD}$, discharging to ground through the respective left-hand decoding branch 112L and the respective right-hand decoding branch 115R, as described with reference to FIGS. 2A and 2B.

The signal Vcomm<n> can be generated on the basis of high-voltage replicas of the signals sLX<7:0>, sLY<7:0> and PX<7:0> generated by the pre-decoding stage 30, the replicas being generated by implementing, within the control circuit 199, level shifters.

In the case where, instead, the pre-decoding stage 30 indicates, through the signals sLX<7:0>, sLY<7:0> and PX<7:0>, deselection of the n-th right-hand word line WL_dx<n>, the corresponding control circuit 199 sets the signal Vcomm<n> at a low logic value (for example, equal to 0V in the reading step and to 2.4V in the writing step). In this way, the right-hand deselection transistor 126R is brought into conduction and the n-th right-hand word line WL_dx<n> is coupled to the supply node $V_{DD}$, so as to be charged. In this case, the right-hand word line WL_dx<n> is decoupled from ground, as described with reference to FIGS. 2A and 2B.

In greater detail, both charging (in the case of deselection) and discharging (in the case of selection) involve the entire right-hand word line WL_dx<n>, i.e., both the portion of the n-th right-hand word line WL_dx<n> that traverses the first right-hand memory array 102A_R and the portion that traverses the second right-hand memory array 102B_R. In fact, as mentioned previously, the right-hand and left-hand local selection stages 110R, 110L of the first and second right-hand memory arrays 102A_R, 102B_R are driven all in the same way. Consequently, in the case of selection, the additional left-hand point $E_{sx}'$ and the additional right-hand point $E_{dx}'$ of the right-hand word line WL_dx<n> are connected to ground, respectively through the corresponding left-hand decoding branch 112L and the corresponding right-hand decoding branch 112R; moreover, in the case of deselection, the aforementioned additional left-hand point $E_{sx}'$ and additional right-hand point $E_{dx}'$ are decoupled from ground. The same considerations apply to the left-hand word lines WL_sx.

In the case of selection of the right-hand word line WL_dx<n>, the column decoder 4 can therefore enable reading in parallel of memory cells 3 coupled to the right-hand word line WL_dx<n> and belonging to the first and/or second right-hand memory arrays 102A_R, 102B_R. More in general, since, as mentioned previously, the right-hand and left-hand local selection stages 110R, 110L of the first and second right-hand memory arrays 102A_R, 102B_R and of the first and second left-hand memory arrays 102A_L, 102B_L receive the same signals sLX, sLY, and PX, and the control circuits 199 drive the corresponding left-hand and right-hand word lines WL_sx, WL_dx in the same way, the column decoder 4 can enable reading in parallel of memory cells 3 of the first and/or second right-hand memory arrays 102A_R, 102B_R coupled to the right-hand word line WL_dx<n> and of memory cells 3 of the first and/or second left-hand memory arrays 102A_L, 102B_L coupled to the left-hand word line WL_sx<n>.

All this being said, the present applicant has noted how, both in the case of row decoders of the type shown in FIGS. 2A-2B and 4A-4B and in the case of row decoders of the type shown in FIGS. 6-7, it is necessary to generate high-voltage signals, i.e., with a voltage comprised between 0V and the supply voltage $V_{DD}$. For example, in the case of row decoders of the type shown in FIGS. 2A-2B and 4A-4B, it is necessary to generate the signals DESELECT_L and DESELECT_R; in the case of row decoders of the type shown in FIGS. 6-7, it is necessary to generate the aforementioned high-voltage replicas of the signals sLX, sLY and PX. Use of the signals involves an increase in current consumption during the reading and writing operations and an increase in the time for selection/deselection of the word lines (the so-called access time).

An aim of an embodiment the present invention is therefore to provide a row decoder that will overcome at least in part the drawbacks of the prior art.

According to embodiments of the present invention, a memory device is provided, as defined in the annexed claims.

BRIEF DESCRIPTION OF THE DRAWINGS

For a better understanding of the present invention, preferred embodiments thereof will now be described, purely by way of example and in a non-limiting way, with reference to the attached drawings, wherein.

DETAILED DESCRIPTION OF ILLUSTRATIVE EMBODIMENTS

Figure 1:
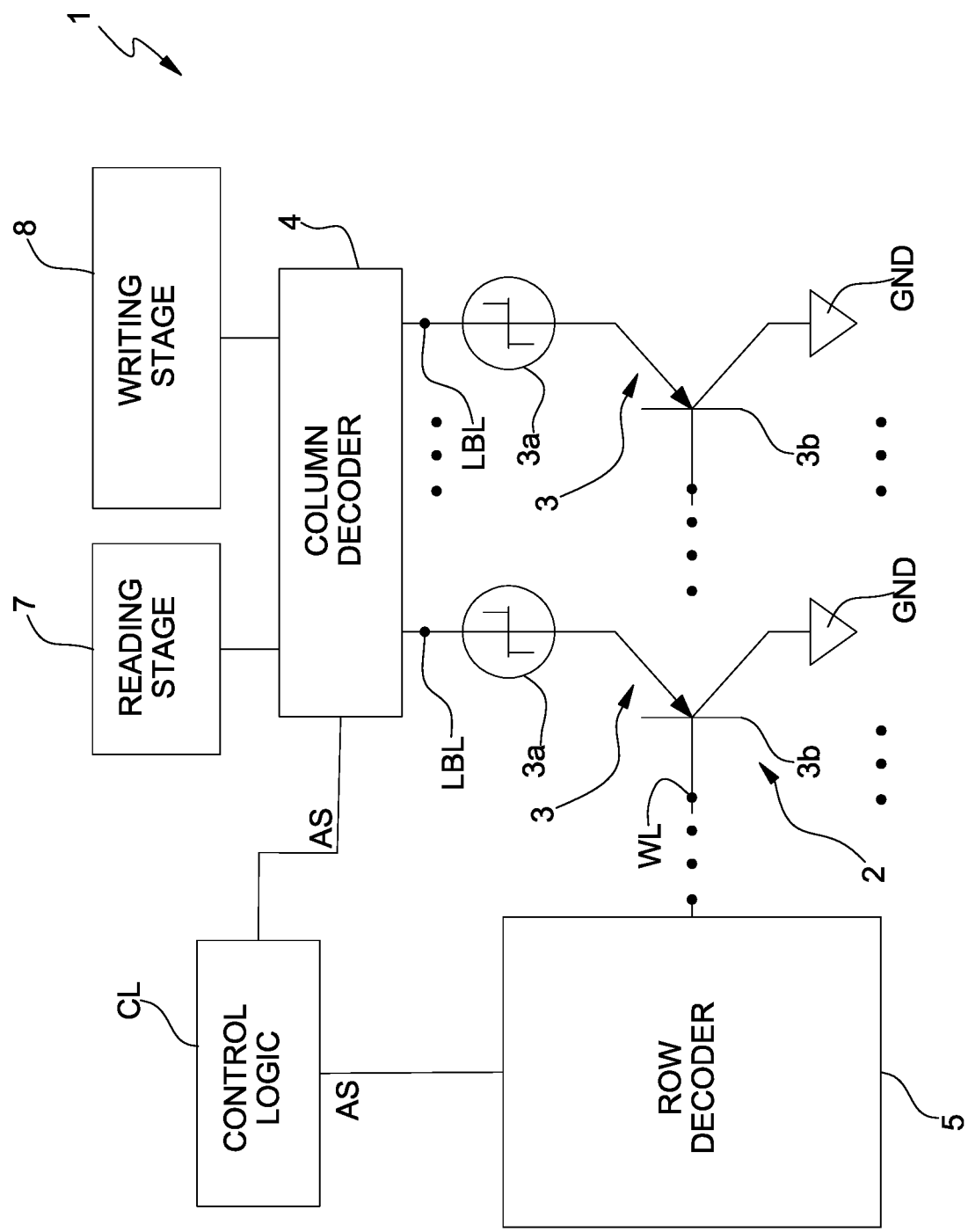
FIG. 1 shows a block diagram of a PCM device.
Figure 2A:
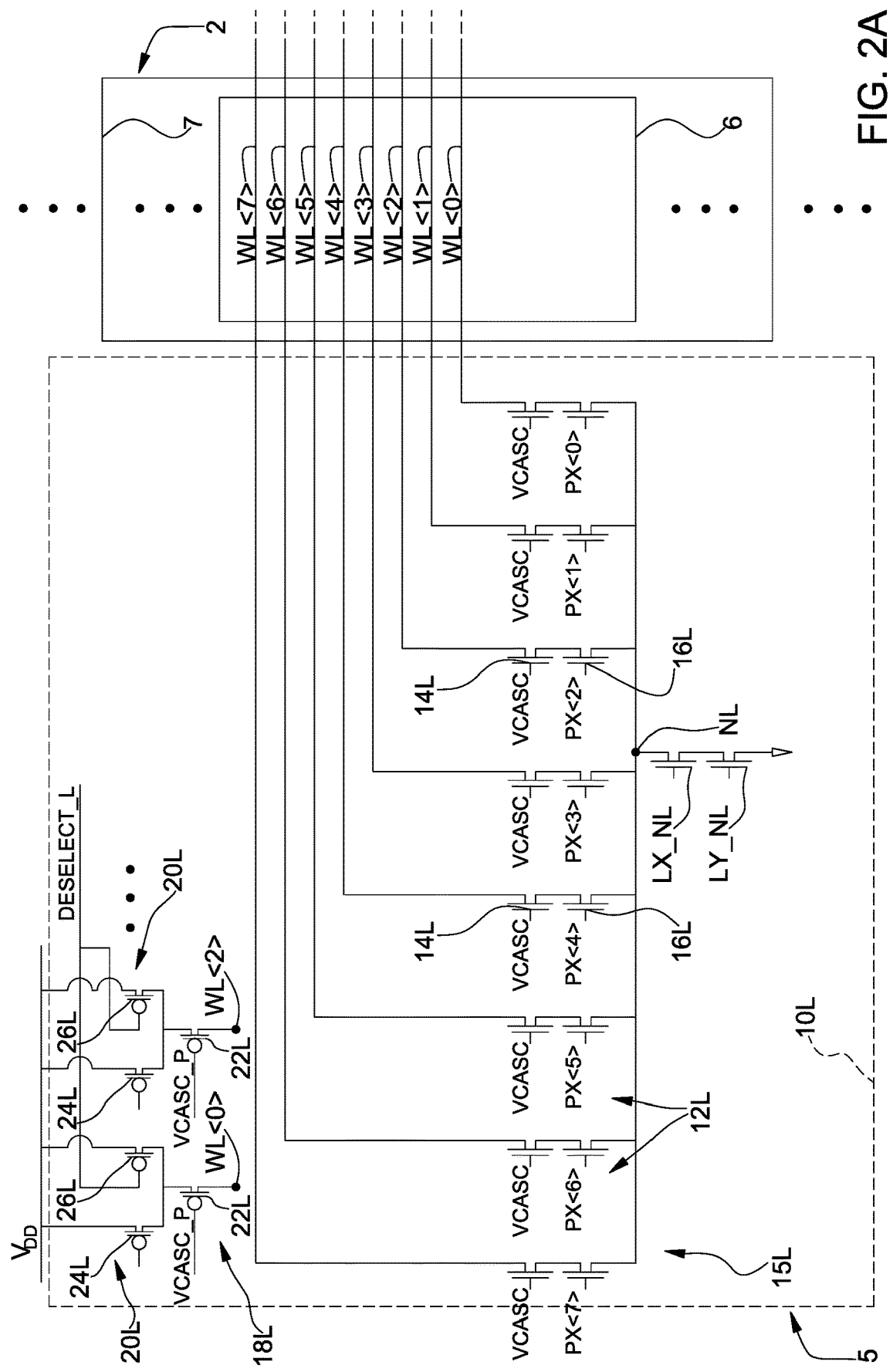
FIGS. 2A and 2B show portions of a same circuit diagram of a row decoder of a known type.
Figure 2B:
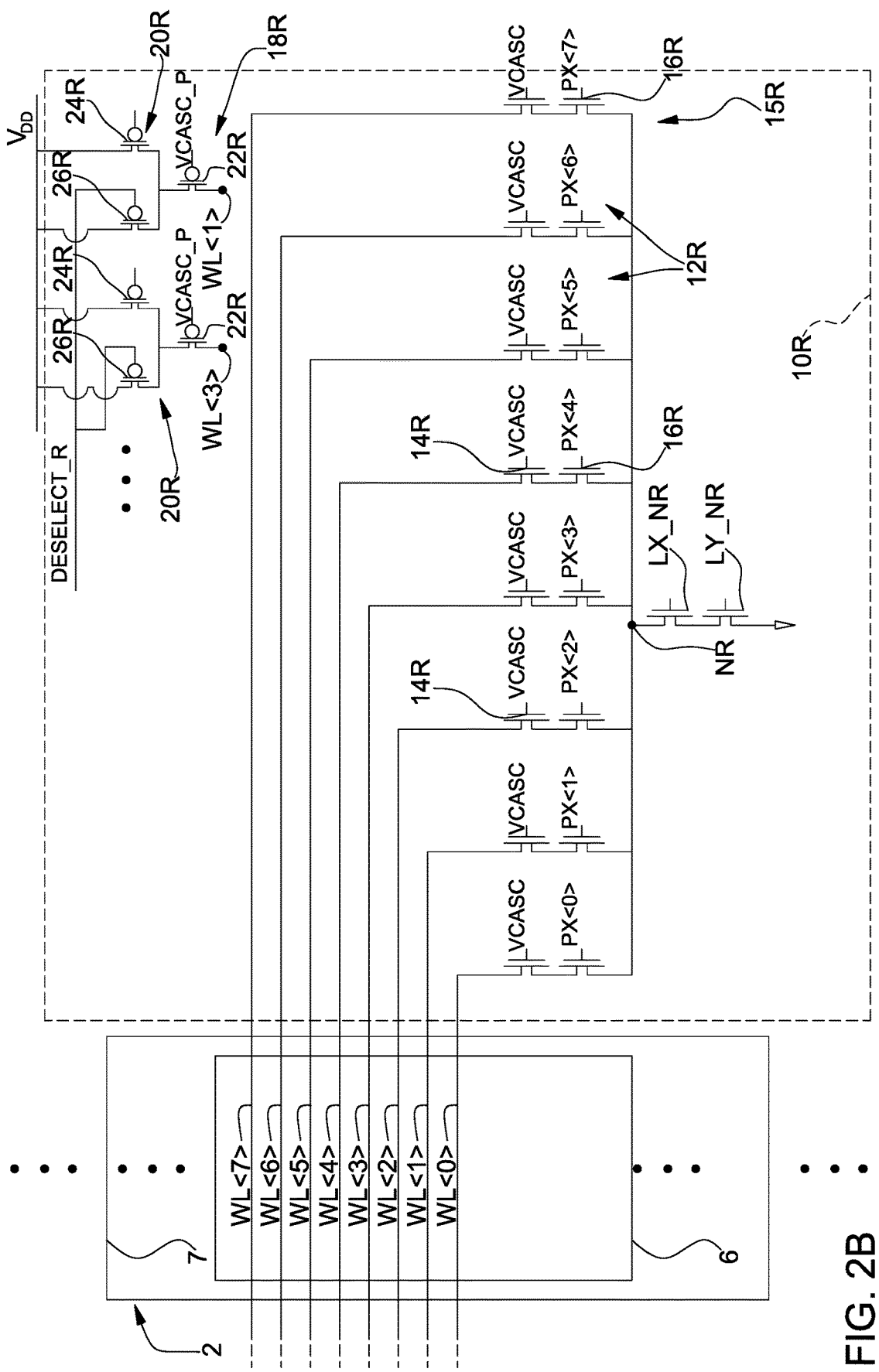
Figure 3:
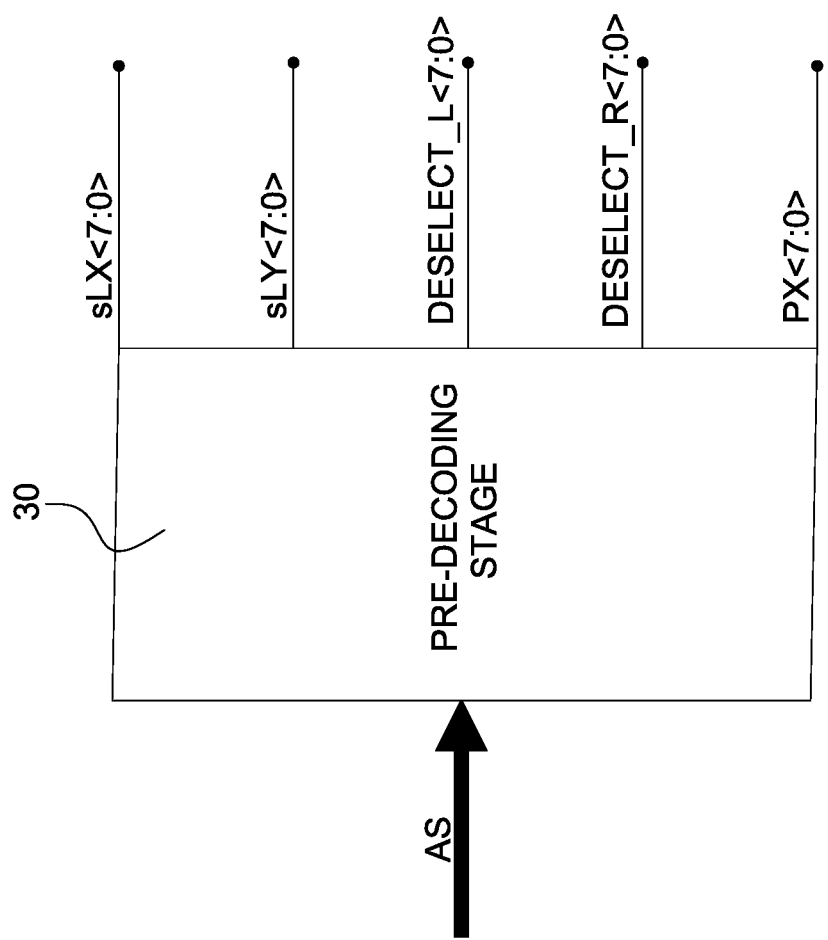
FIG. 3 shows a block diagram of a portion of a row decoder.
Figure 4A:
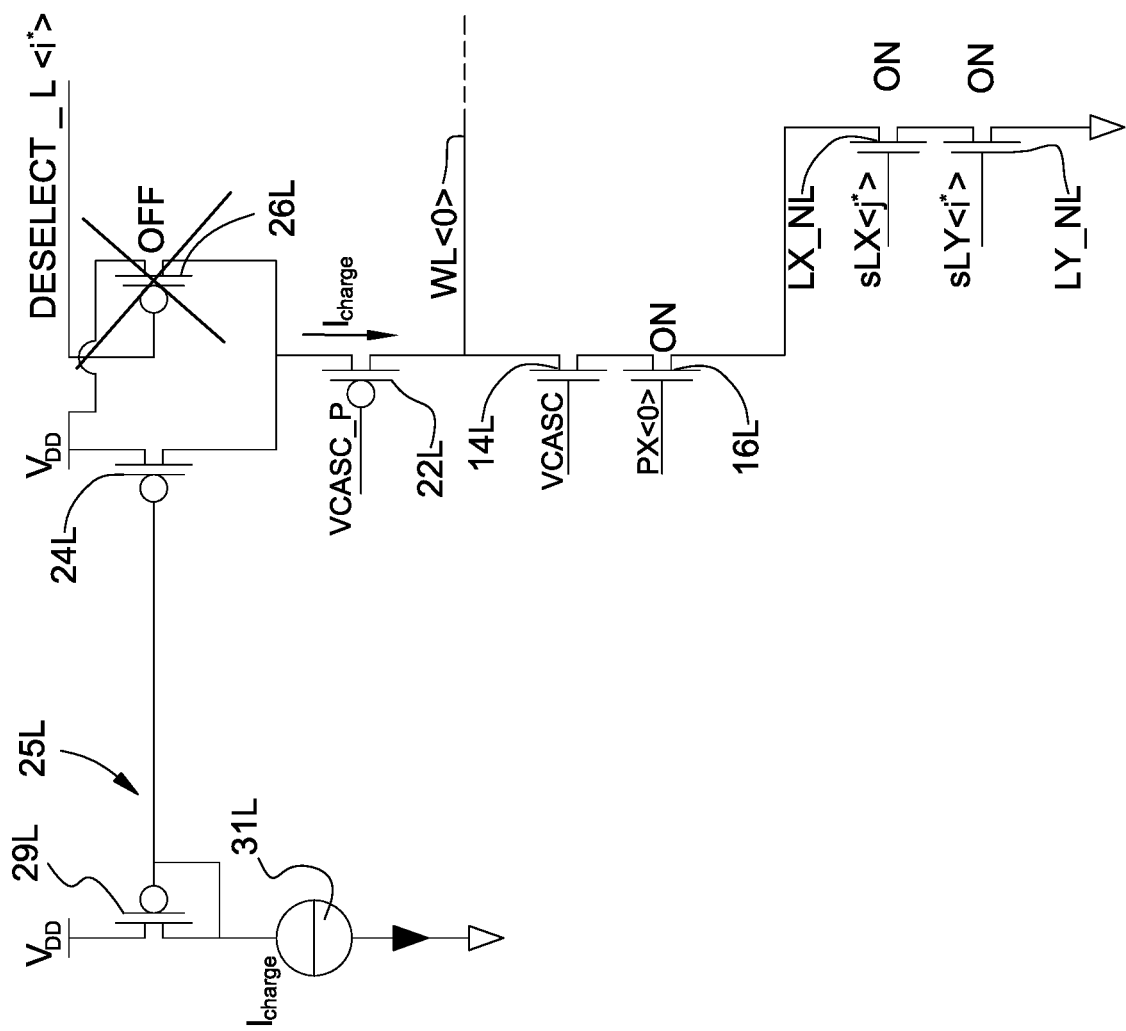
FIGS. 4A and 4B show circuit diagrams of portions of the row decoder represented in FIGS. 2A and 2B.
Figure 4B:
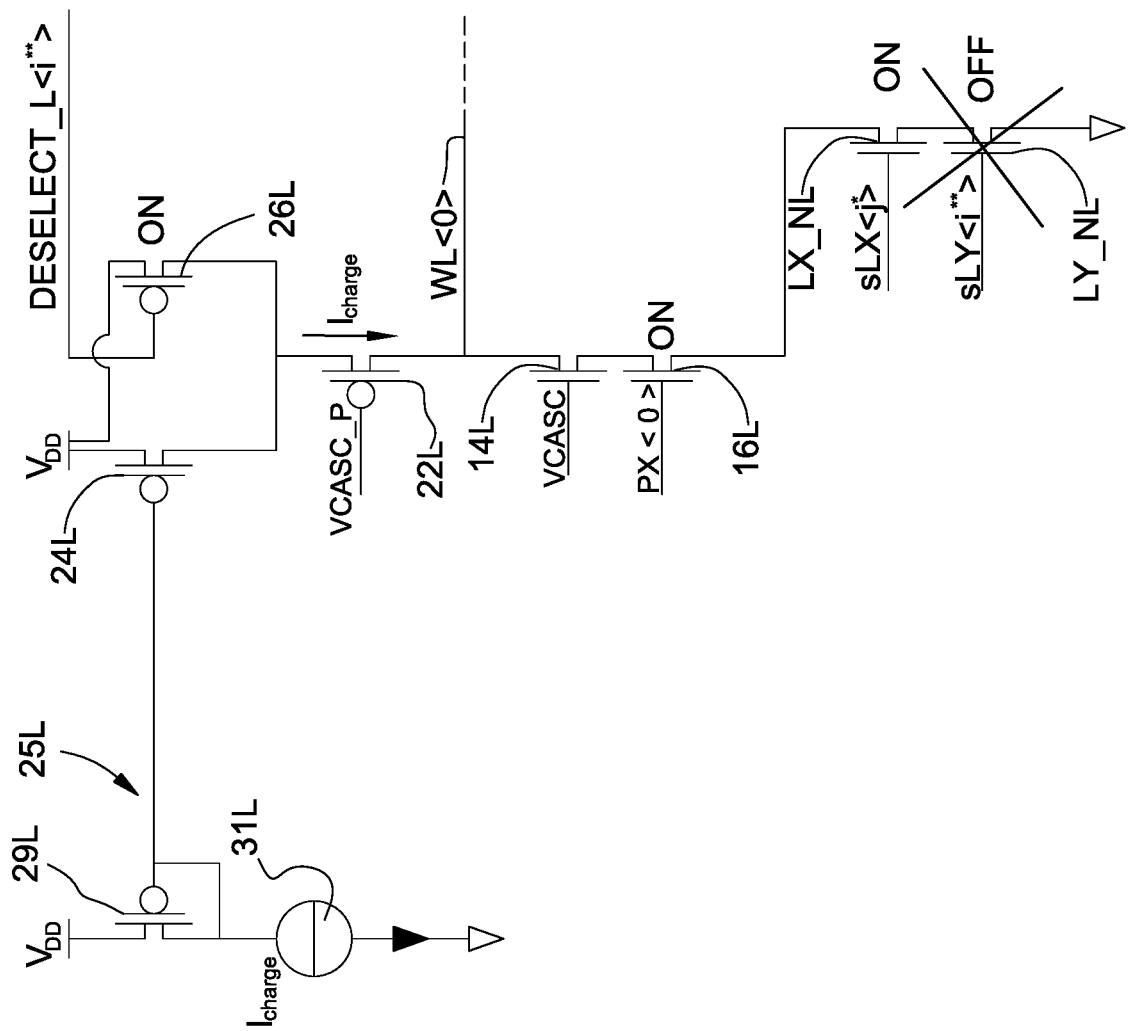
Figure 5:
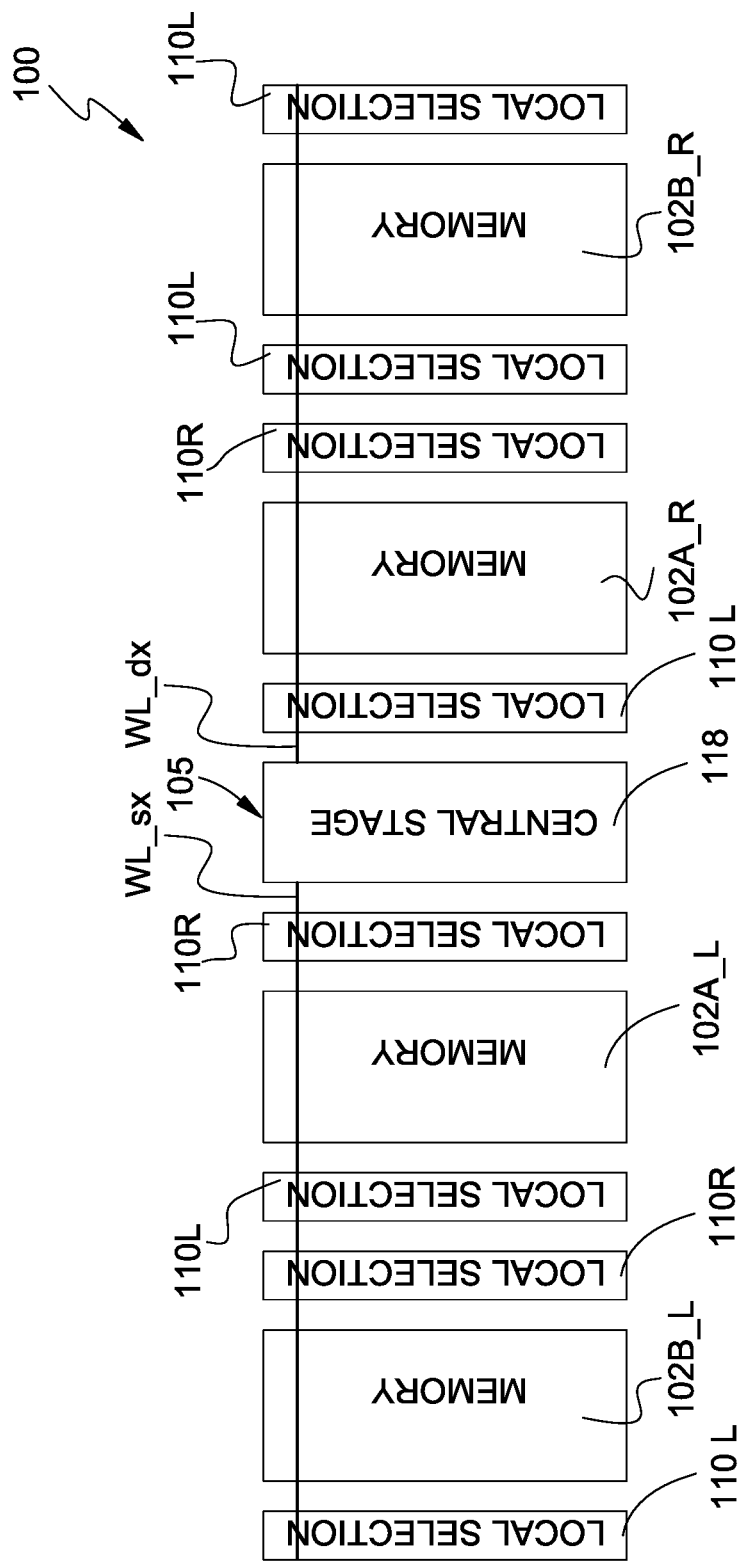
FIG. 5 shows a block diagram of an example of the present memory device.
Figure 6:
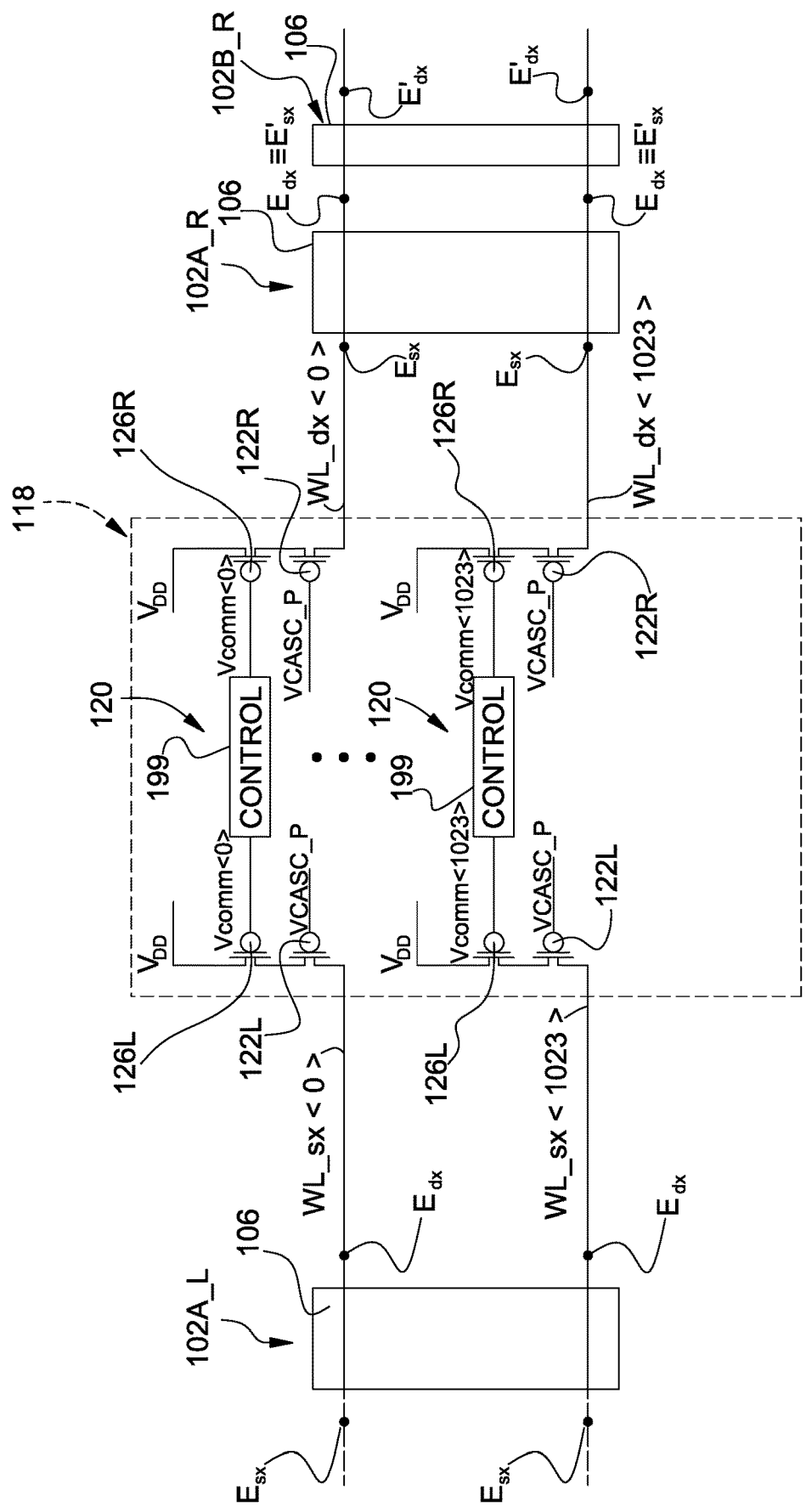
FIG. 6 shows a circuit diagram of a portion of a row decoder of the memory device represented in FIG. 5, coupled to a pair of memory arrays (represented schematically)
Figure 7:
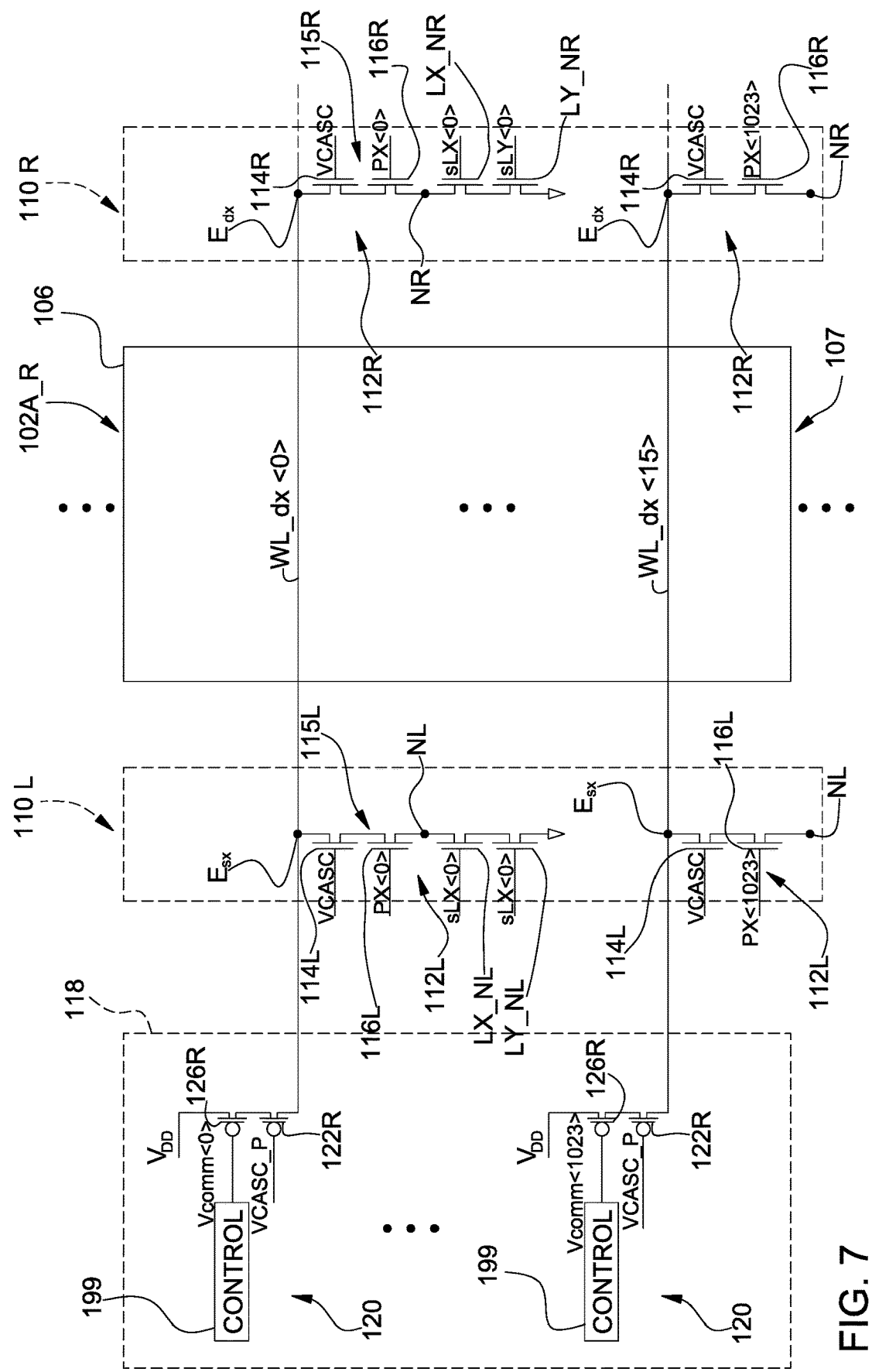
FIG. 7 shows a circuit diagram of a portion of the memory device represented in FIG. 5.
Figure 8:
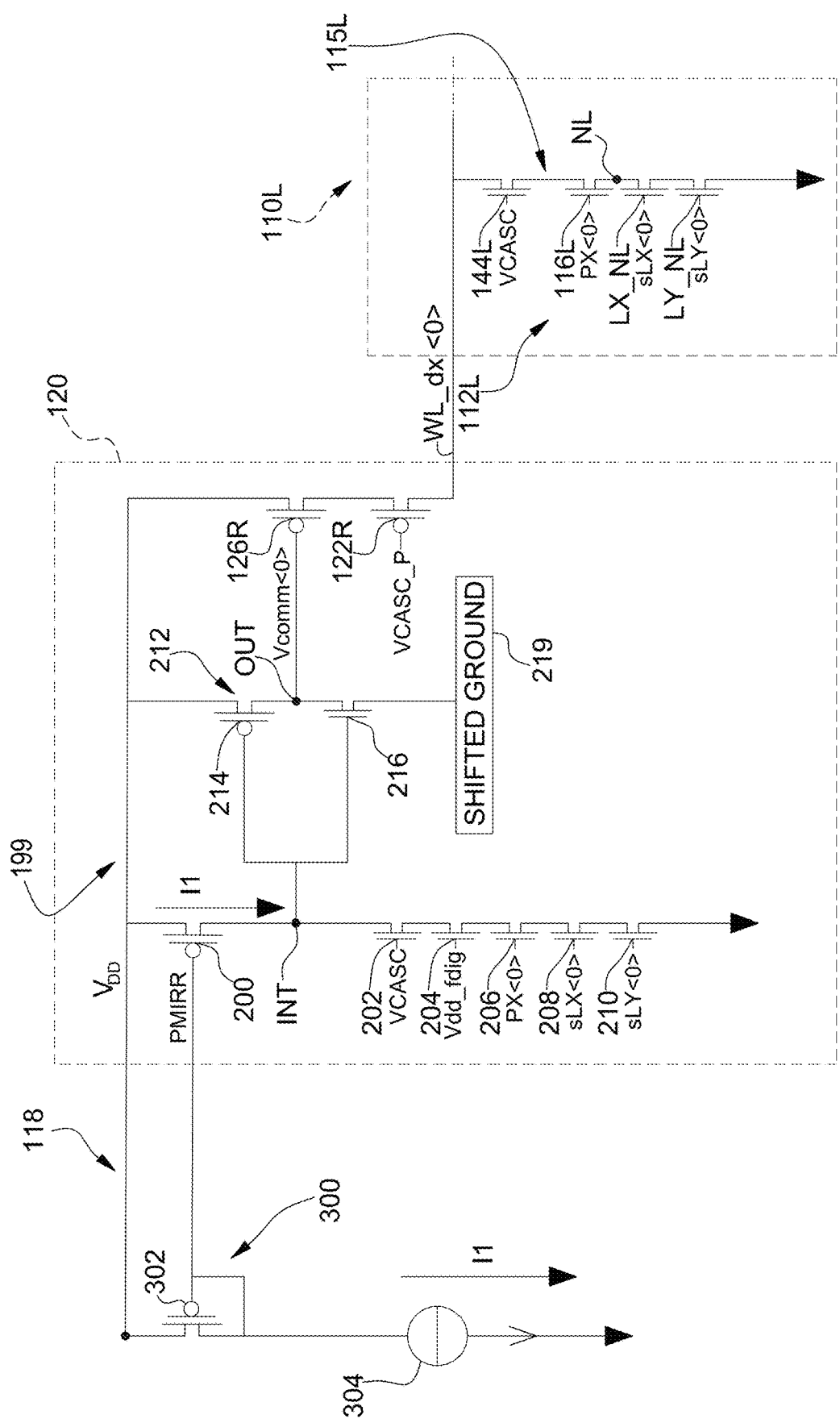
FIG. 8 shows a circuit diagram of a portion of a row decoder.

The ensuing description refers to a possible implementation of the control circuits 199 for the central pull-up circuits 120 of the central deselection stage 118. Consequently, except where otherwise specified, reference is made to the non-volatile memory device 100 shown in FIGS. 5-7. Moreover, as shown in FIG. 8, in what follows reference is made, purely by way of example, and except where otherwise specified, to the control circuit 199 coupled to the right-hand word line WL_dx<0> (as well as to the left-hand word line WL_sx<0>) of the subarray 106 associated with the index j=0 of the group 107 associated with the index i=0. The control circuits 199 are in any case the same as one another.

In detail, as shown, in fact, in FIG. 8, the control circuit 199 comprises a respective local mirror transistor 200 (P-channel enhancement MOSFET), a first local cascode transistor 202 and a second local cascode transistor 204 (both of which are N-channel enhancement MOSFETs), a first local selection transistor 206, a second local selection transistor 208, and a third local selection transistor 210 (which are also N-channel enhancement MOSFETs), and an inverter circuit 212.

In greater detail, the source terminal of the local mirror transistor 200 is set at the supply voltage $V_{DD}$, whereas the drain terminal forms a node INT.

The first and second local cascode transistors 202, 204 and the first, second, and third local selection transistors 206, 208, 210 are connected in series between the node INT and ground, according to the following sequence (in the direction from ground to the node INT): the third, second, and first local selection transistors 210, 208, 206, the second local cascode transistor 204, and finally the first local cascode transistor 202.

On the gate terminals of the first and second local cascode transistors 202, 204 the first cascode voltage VCASC and a third cascode voltage Vdd_fdig are, respectively, present, which assume a same value during the reading operations and the writing operations (for example, equal to 1V). As has been said previously, the first cascode voltage VCASC is, for example, 1.8V in the reading step and 2.4V in the writing step. Furthermore, on the gate terminals of the first, second, and third local selection transistors 206, 208, 210 the signals PX<0>, sLX<0> and sLY<0> are respectively present, which make it possible to address the right-hand word line WL_dx<0>. In other words, in the case (not shown) of a generic central pull-up circuit 120 coupled to a generic right-hand word line WL_dx<m> of a j-th subarray 106 of an i-th group 107, the gate terminals of the corresponding first, second, and third local selection transistors 206, 208, 210 receive, respectively, the signals PX<m>, sLX<j> and sLY<i>, which, as has been said previously, are low-voltage signals generated by the pre-decoding stage 30, with a dynamic range comprised, for example, between 0V and 1V.

Once again with reference to FIG. 8, the inverter circuit 212 comprises a first inverter transistor 214 (P-channel enhancement MOSFET) and a second inverter transistor 216 (N-channel enhancement MOSFET). The gate terminals of the first and second inverter transistors 214, 216 are connected to the node INT. The source terminal of the first inverter transistor 214 is set at the supply voltage $V_{DD}$. The drain terminals of the first and second inverter transistors 214, 216 are connected together and form a node OUT. The source terminal of the second inverter transistor 216 is connected to a shifted-ground circuit 219.

In greater detail, the shifted-ground circuit 219 sets the source terminal of the second inverter transistor 216 at a voltage of 0V, during reading, and of 2.4V, during writing. The node OUT is connected to the gate terminal of the right-hand deselection transistor 126R. On the node OUT the signal Vcomm<0> is present.

The central deselection stage 118 further comprises a main circuit 300, which comprises a main transistor 302 (P-channel enhancement MOSFET), the source terminal of which is set at the supply voltage $V_{DD}$ and the gate terminal of which is connected to the drain terminal. The main circuit 300 further comprises a main current generator 304, which generates a current I1. The drain terminal of the main transistor 302 is connected to a first terminal of the main current generator 304, the second terminal of which is connected to ground.

The gate terminal of the main transistor 302 is connected to the gate terminals of the local mirror transistors 200 of the control circuits 199 so as to form a current mirror, for example with unit mirror ratio. In other words, the main circuit 300 is shared between the control circuits 199, so as to mirror, in each of the local mirror transistors 200, the current I1, which is injected into the corresponding nodes INT. Even more in particular, if we denote by PMIRR the voltage present on the gate terminal of the main transistor 302, the voltage PMIRR controls the local mirror transistors 200.

As mentioned previously, the supply voltage $V_{DD}$ is, for example, equal to 1.8V in the reading step and to 4.8V in the writing step. Moreover, the first cascode voltage VCASC is, for example, equal to 1.8V in the reading step and to 2.4V in the writing step. In addition, the second cascode voltage VCASC__P is, for example, equal to 0V in the reading step and to 2.4V in the writing step. All this being said, in use, what is described below, once again with reference to FIG. 8, is found.

In the reading step, in the case of selection of the aforementioned right-hand word line WL_dx<0>, it is found that the signals sLY<0>, sLX<0> and PX<0> are all equal to '1', in which case the first and second local cascode transistors 202, 204 and the first, second, and third local selection transistors 206, 208, 210 are conducting, and therefore the node INT is set approximately at ground. In addition, the local mirror transistor 200 injects into the node INT the current I1 (for example, is approximately equal to 25 μA), which then flows in the first and second local cascode transistors 202, 204 and in the first, second and third local selection transistors 206, 208, 210. For example, the node INT is at a voltage of approximately 0.1V. Consequently, on the node OUT, at output from the inverter circuit 212, the signal Vcomm<0> is equal to '1'; in particular, the signal Vcomm<0> is approximately equal to 1.8V. The right-hand deselection transistor 126R is therefore inhibited, with consequent decoupling of the aforementioned right-hand word line WL_dx<0> from the supply voltage $V_{DD}$. The right-hand word line WL_dx<0> therefore discharges to ground, as described with reference to FIGS. 6-7.

Once again in the reading step, in the case of deselection of the aforementioned right-hand word line WL_dx<0>, it is found that at least one of the signals sLY<0>, sLX<0> and PX<0> is equal to '0', and therefore the transistor controlled thereby is inhibited. The node INT is consequently decoupled from ground and is set at a voltage of approximately 1.8V, so that the local mirror transistor 200 is off, because it has a zero drain-to-source voltage; therefore, it is not able to mirror the current I1. Consequently, on the node OUT, the signal Vcomm<0> is equal to '0'; in particular, the signal Vcomm<0> is approximately equal to 0V. The right-hand deselection transistor 126R is therefore above threshold, as likewise the top right-hand cascode transistor 122R. Through the right-hand deselection transistor 126R and the top right-hand cascode transistor 122R, the aforementioned right-hand word line WL_dx<0> (which, as explained previously, is decoupled from ground) is set at a voltage of approximately 1.8V and is therefore deselected.

In the writing step, what has been said as regards the reading step applies, expect for the following differences.

In the case of selection of the aforementioned right-hand word line WL_dx<0>, the signal Vcomm<0> is again equal to '1' and is approximately equal to 4.8V. In the case of deselection of the aforementioned right-hand word line WL_dx<0>, the node INT is again decoupled from the ground and is set at a voltage approximately equal to 4.8V.

As mentioned previously, the control circuit 199 coupled to the right-hand word line WL_dx<0> is also coupled to the corresponding left-hand word line WL_sx<0>. In particular, albeit not shown, the node OUT is also connected to the gate terminal of the corresponding left-hand deselection transistor 126L (FIG. 6), so that the left-hand word line WL_sx<0> is selected/deselected in the same way as the corresponding right-hand word line WL_sx<0>.

In practice, the control circuit 199 receives corresponding signals sLX, sLY and PX, generated at low-voltage by the pre-decoding stage 30, and, without any need to perform any level shifting, enables the central pull-up circuit 120 to raise the voltage of the right-hand and left-hand word lines coupled thereto, when these are deselected.

Albeit not shown, the present implementation of the control circuit 199 can also be used in the case of the left-hand pull-up circuits 20L and right-hand pull-up circuits 20R shown in FIGS. 2A-2B and 4A-4B. In this case, the gate terminals of the left-hand deselection transistors 26L and of the right-hand deselection transistors 26R are each connected to the node OUT of a corresponding control circuit 199 so as to receive, instead of the signal DESELECT_L or DESELECT_R, the corresponding signal Vcomm. In this case, the left-hand and right-hand biasing transistors 24L, 24R are absent, as also are the current mirrors formed thereby.

Figure 9:
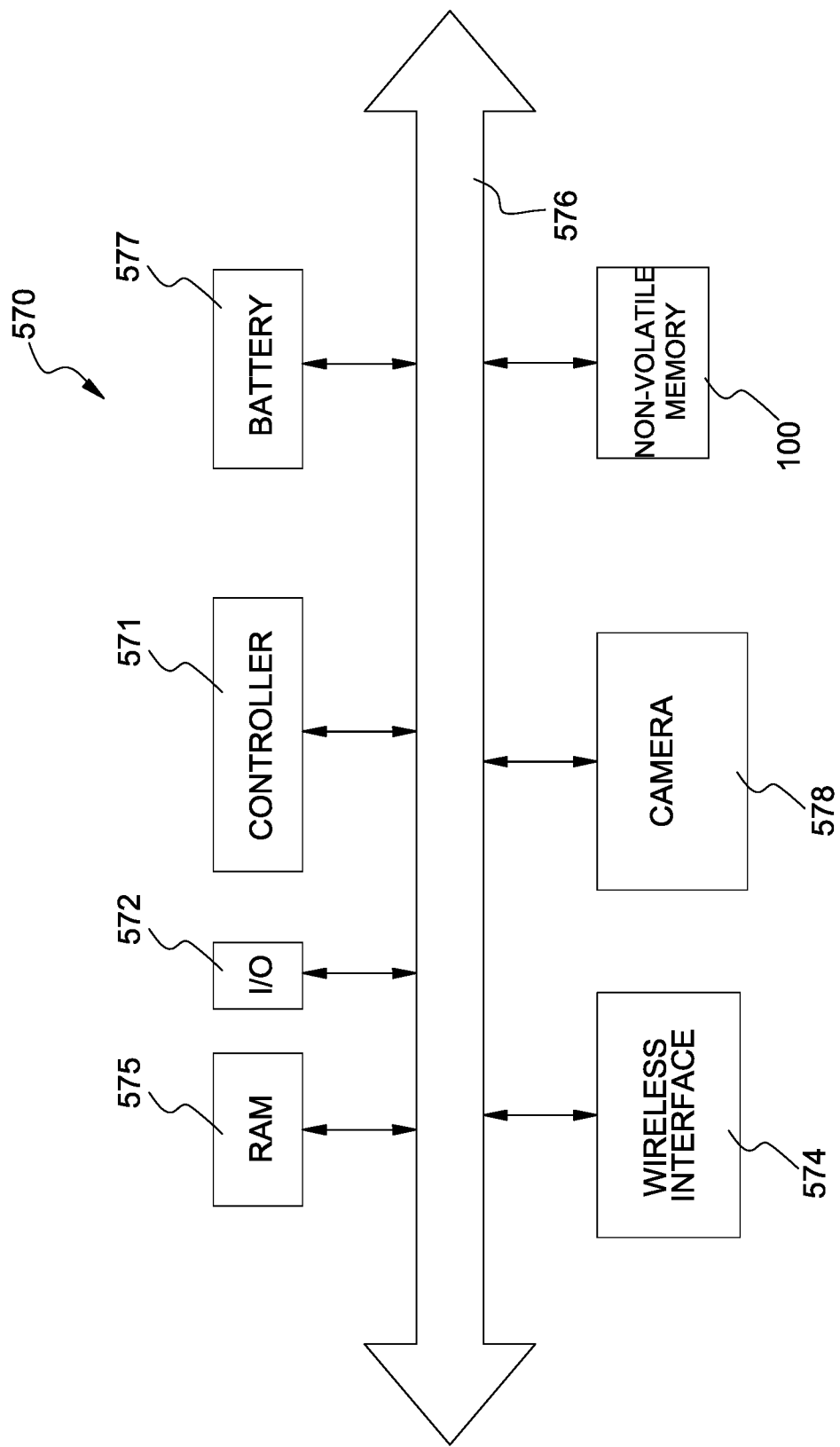
FIG. 9 shows a block diagram of an electronic apparatus that incorporates the present memory device.

For practical purposes, the non-volatile memory device 100 can find use in numerous applications. For instance, FIG. 9 illustrates a portion of an electronic apparatus 570, which may, for example, be: a PDA (Personal Digital Assistant); a portable or fixed computer, possibly with wireless data-transfer capacity; a mobile phone; a digital audio player; a photographic camera or a camcorder; or further devices capable of processing, storing, transmitting, and receiving information.

In detail, the electronic apparatus 570 comprises: a controller 571 (for example, provided with a microprocessor, a DSP, or a microcontroller); an input/output device 572 (for example, provided with a keypad and a display), for input and display of the data; the non-volatile memory device 100; a wireless interface 574, for example an antenna, for transmitting and receiving data through a radio-frequency wireless communication network; and a RAM 575. All the components of the electronic apparatus 570 are coupled through a bus 576. It is possible to use a battery 577 as electrical supply source in the electronic apparatus 570, which can moreover be provided with a photographic camera or a video camera 578. Furthermore, the controller 571 can control the non-volatile memory device 100, for example by co-operating with the control logic CL.

The advantages that the present row decoder affords emerge clearly from the foregoing description. In particular, as explained previously, the present row decoder is able to operate on the basis of low-voltage signals, with consequent advantages in terms of reduction in consumption and possibility of adopting low-voltage transistors. In addition, the row decoder does not have to carry out any level shifting that depends upon the (reading or writing) step being carried out, and therefore upon the value of the supply voltage $V_{DD}$.

The present row decoder finds a particularly advantageous use in the case of memory devices with active-line consumption, i.e., where the word lines, when selected, are traversed by current.

Finally, it is clear that modifications and variations may be made to what has been described and illustrated herein, without thereby departing from the scope of the present invention, as defined in the annexed claims.

For instance, the memory cells may be of a type different from what has been described. In particular, the access element 3b may be of a type different from what has been described; for example, it may be a MOSFET transistor. On the other hand, the access element 3b may even be absent, as for example in the case of a so-called non-volatile memory device of a FLASH type.

It is moreover possible for the memory device 100 to comprise a different number and/or a different arrangement of the memory arrays. Moreover, the scheme of hierarchical selection of the subarrays 106 may be different from what has been described.

Finally, it is possible for the type, number and arrangement of the cascode transistors to be different from to what has been described. For example, albeit not shown, a corresponding cascode MOSFET, for example an N-channel enhancement MOSFET with gate terminal set, for instance, at 1V, may be interposed between the drain terminal of each second left-hand pre-selection transistor LX_NL and the corresponding left-hand common node NL. Likewise, a corresponding cascode MOSFET, for example an N-channel enhancement MOSFET with gate terminal set, for instance, at 1V may be interposed between the drain terminal of each second right-hand pre-selection transistor LX_NR and the corresponding right-hand common node NR.

What is claimed is:

1. A non-volatile memory device comprising:
    at least a first array of memory cells, arranged in rows and coupled to first word lines; and
    a row decoder, comprising:

a pull-down stage configured so as to carry out, for each first word line, operations of:
  coupling the first word line to a node at reference potential, in a step of selection of the first word line; and
  decoupling the first word line from the node at reference potential, in a step of deselection of the first word line;
a pull-up stage, comprising, for each first word line:
  a corresponding control circuit configured to generate a corresponding control signal; and
  a corresponding first pull-up switch circuit, which is controlled via the corresponding control signal so as to carry out, alternatively, operations of:
    coupling the first word line to a supply node, in the step of deselection of the first word line; and
    decoupling the first word line from the supply node, in the step of selection of the first word line;
wherein each control circuit comprises:
  an internal node;
  a current mirror, coupled to the supply node and to the internal node and configured to inject a mirrored current into the internal node; and
  a series switch circuit, interposed between the internal node and the node at reference potential;
wherein, in the step of deselection of the first word line, the corresponding series switch circuit is configured to decouple the corresponding internal node from the node at reference potential, so as to cause an increase in a voltage on the corresponding internal node;
wherein, in the step of selection of the first word line, the corresponding series switch circuit is configured to couple the corresponding internal node to the node at reference potential, so as to cause a decrease in the voltage on the corresponding internal node; and
wherein each control circuit is configured to generate the corresponding control signal as a function of the voltage on the respective internal node.

2. The memory device according to claim 1, further comprising a decoding stage configured to generate a plurality of selection signals;
wherein each first word line is associated with a corresponding subset of selection signals;
wherein the pull-down stage comprises, for each first word line, a corresponding first discharge circuit, which is interposed between the first word line and the node at reference potential and includes a number of respective switches connected in series, each of which is controlled via a respective selection signal from among the selection signals associated with the first word line;
wherein the series switch circuit of each control circuit comprises a number of respective switches equal to the number of the switches of each first discharge circuit, the switches of each series switch circuit being connected in series; and
wherein each switch of the series switch circuit is controlled via a respective selection signal from among the selection signals associated with the corresponding first word line.

3. The memory device according to claim 2, wherein the first array is divided into subarrays that include a same number of first word lines;
wherein, for each first word line, the corresponding subset of selection signals with which the first word line is associated comprises a respective first selection signal and a respective second selection signal;
wherein the first selection signals associated with the first word lines of each subarray are signals that are different from one another;
wherein, for each subarray, the subsets of selection signals of the respective first word lines share a same second selection signal, associated with the subarray;
wherein, for each first word line of each subarray, the corresponding first discharge circuit comprises a corresponding first pull-down switch circuit, which is coupled to a first point of the corresponding first word line and is controlled via the corresponding first selection signal so as to:
  couple the first point to a corresponding first node, in the step of selection of the first word line; and
  decouple the first point from the corresponding first node, in the step of deselection of the first word line;
wherein the first nodes corresponding to the first word lines of each subarray electrically coincide with a corresponding first common node;
wherein the first discharge circuits of the first word lines of each subarray moreover share a first subarray-selection circuit, which is interposed between the corresponding first common node and the node at reference potential and is controlled via at least the second selection signal associated with the subarray so as to:
  couple the corresponding first common node to the node at reference potential, when one of the first word lines of the subarray is selected; and
  decouple the corresponding first common node from the node at reference potential, when all the first word lines of the subarray are deselected; and
wherein, for each first word line of each subarray, the series switch circuit of the corresponding control circuit comprises:
  a respective first switch, which is controlled via the first selection signal associated with the first word line; and
  a respective second switch, which is controlled via the second selection signal associated with the subarray.

4. The memory device according to claim 3, wherein the subarrays are grouped together in groups, which include a same number of subarrays;
wherein the second selection signals associated with the subarrays of each group are different from one another;
wherein, for each first word line, the corresponding subset of selection signals with which the first word line is associated further comprises a respective third selection signal;
wherein, for each group of subarrays, the subsets of selection signals of the respective first word lines share a same third selection signal, which is associated with the group;
wherein, for each subarray, the corresponding first subarray-selection circuit is controlled also through the third selection signal associated with the group to which the subarray belongs; and
wherein, for each first word line of each subarray of each group, the series switch circuit of the corresponding control circuit further comprises a respective third switch, which is controlled via the third selection signal associated with the group.

5. The memory device according to claim 3, wherein the pull-down stage further comprises, for each first word line, a corresponding second discharge circuit, which is the same as the first discharge circuit, the first and second discharge circuits being arranged on opposite sides of the first array;

wherein, for each first word line of each subarray, the corresponding second discharge circuit comprises a corresponding second pull-down switch circuit, which is coupled to a second point of the corresponding first word line and is controlled via the corresponding first selection signal so as to:
couple the second point to a corresponding second node, in the step of selection of the first word line;
decouple the second point from the corresponding second node, in the step of deselection of the first word line;
wherein the second nodes corresponding to the first word lines of each subarray electrically coincide with a corresponding second common node; and
wherein the second discharge circuits of the first word lines of each subarray moreover share a second subarray-selection circuit, which is interposed between the corresponding second common node and the node at reference potential and is controlled via at least the second selection signal associated with the subarray so as to:
couple the corresponding second common node to the node at reference potential, when one of the first word lines of the subarray is selected; and
decouple the corresponding second common node from the node at reference potential, when all the first word lines of the subarray are deselected.

6. The memory device according to claim 3, further comprising a second array of memory cells, arranged in rows and coupled to second word lines, each of which corresponds to a corresponding first word line;
wherein the row decoder further comprises an additional pull-down stage, which is configured so as to carry out, for each second word line, operations of:
coupling the second word line to the node at reference potential, in a step of selection of the second word line; and
decoupling the second word line from the node at reference potential, in a step of deselection of the second word line; and
wherein the pull-up stage further comprises, for each second word line, a corresponding second pull-up switch circuit, which is controlled via the corresponding control signal so as to, alternatively:
couple the second word line to the supply node, in the step of deselection of the second word line; and
decouple the second word line from the supply node, in the step of selection of the second word line.

7. The memory device according to claim 6, wherein the pull-up stage is interposed between the first and second arrays.

8. The memory device according to claim 1, wherein each control circuit further comprises a respective inverter circuit, interposed between the respective internal node and the corresponding first pull-up switch circuit.

9. The memory device according to claim 1, wherein each memory cell comprises a respective selector and a phase-change element.

10. The memory device according to claim 9, wherein the respective selector comprises a bipolar transistor.

11. An electronic apparatus comprising:
a non-volatile memory device comprising:
at least a first array of memory cells, arranged in rows and coupled to first word lines; and
a row decoder, comprising:
a pull-down stage configured so as to carry out, for each first word line, operations of:
coupling the first word line to a node at reference potential, in a step of selection of the first word line; and
decoupling the first word line from the node at reference potential, in a step of deselection of the first word line;
a pull-up stage, comprising, for each first word line:
a corresponding control circuit configured to generate a corresponding control signal; and
a corresponding first pull-up switch circuit, which is controlled via the corresponding control signal so as to carry out, alternatively, operations of:
coupling the first word line to a supply node, in the step of deselection of the first word line; and
decoupling the first word line from the supply node, in the step of selection of the first word line;
wherein each control circuit comprises:
an internal node;
a current mirror, coupled to the supply node and to the internal node and configured to inject a mirrored current into the internal node; and
a series switch circuit, interposed between the internal node and the node at reference potential;
wherein, in the step of deselection of the first word line, the corresponding series switch circuit is configured to decouple the corresponding internal node from the node at reference potential, so as to cause an increase in a voltage on the corresponding internal node;
wherein, in the step of selection of the first word line, the corresponding series switch circuit is configured to couple the corresponding internal node to the node at reference potential, so as to cause a decrease in the voltage on the corresponding internal node; and
wherein each control circuit is configured to generate the corresponding control signal as a function of the voltage on the respective internal node;
a controller; and
a bus communicatively coupling the controller and the memory device.

12. The electronic apparatus according to claim 11, wherein the non-volatile memory device further comprises a decoding stage configured to generate a plurality of selection signals;
wherein each first word line is associated with a corresponding subset of selection signals;
wherein the pull-down stage comprises, for each first word line, a corresponding first discharge circuit, which is interposed between the first word line and the node at reference potential and includes a number of respective switches connected in series, each of which is controlled via a respective selection signal from among the selection signals associated with the first word line;
wherein the series switch circuit of each control circuit comprises a number of respective switches equal to the number of the switches of each first discharge circuit, the switches of each series switch circuit being connected in series; and
wherein each switch of the series switch circuit is controlled via a respective selection signal from among the selection signals associated with the corresponding first word line.

13. The electronic apparatus according to claim 12, wherein the first array is divided into subarrays that include a same number of first word lines;

wherein, for each first word line, the corresponding subset of selection signals with which the first word line is associated comprises a respective first selection signal and a respective second selection signal;

wherein the first selection signals associated with the first word lines of each subarray are signals that are different from one another;

wherein, for each subarray, the subsets of selection signals of the respective first word lines share a same second selection signal, associated with the subarray;

wherein, for each first word line of each subarray, the corresponding first discharge circuit comprises a corresponding first pull-down switch circuit, which is coupled to a first point of the corresponding first word line and is controlled via the corresponding first selection signal so as to:
couple the first point to a corresponding first node, in the step of selection of the first word line; and
decouple the first point from the corresponding first node, in the step of deselection of the first word line;

wherein the first nodes corresponding to the first word lines of each subarray electrically coincide with a corresponding first common node;

wherein the first discharge circuits of the first word lines of each subarray moreover share a first subarray-selection circuit, which is interposed between the corresponding first common node and the node at reference potential and is controlled via at least the second selection signal associated with the subarray so as to:
couple the corresponding first common node to the node at reference potential, when one of the first word lines of the subarray is selected; and
decouple the corresponding first common node from the node at reference potential, when all the first word lines of the subarray are deselected; and wherein, for each first word line of each subarray, the series switch circuit of the corresponding control circuit comprises:
a respective first switch, which is controlled via the first selection signal associated with the first word line; and
a respective second switch, which is controlled via the second selection signal associated with the subarray.

14. The electronic apparatus according to claim 13, wherein the subarrays are grouped together in groups, which include a same number of subarrays;
wherein the second selection signals associated with the subarrays of each group are different from one another;
wherein, for each first word line, the corresponding subset of selection signals with which the first word line is associated further comprises a respective third selection signal;
wherein, for each group of subarrays, the subsets of selection signals of the respective first word lines share a same third selection signal, which is associated with the group;
wherein, for each subarray, the corresponding first subarray-selection circuit is controlled also through the third selection signal associated with the group to which the subarray belongs; and
wherein, for each first word line of each subarray of each group, the series switch circuit of the corresponding control circuit further comprises a respective third switch, which is controlled via the third selection signal associated with the group.

15. The electronic apparatus according to claim 13, wherein the pull-down stage further comprises, for each first word line, a corresponding second discharge circuit, which is the same as the first discharge circuit, the first and second discharge circuits being arranged on opposite sides of the first array;
wherein, for each first word line of each subarray, the corresponding second discharge circuit comprises a corresponding second pull-down switch circuit, which is coupled to a second point of the corresponding first word line and is controlled via the corresponding first selection signal so as to:
couple the second point to a corresponding second node, in the step of selection of the first word line;
decouple the second point from the corresponding second node, in the step of deselection of the first word line;

wherein the second nodes corresponding to the first word lines of each subarray electrically coincide with a corresponding second common node; and wherein the second discharge circuits of the first word lines of each subarray moreover share a second subarray-selection circuit, which is interposed between the corresponding second common node and the node at reference potential and is controlled via at least the second selection signal associated with the subarray so as to:
couple the corresponding second common node to the node at reference potential, when one of the first word lines of the subarray is selected; and
decouple the corresponding second common node from the node at reference potential, when all the first word lines of the subarray are deselected.

16. The electronic apparatus according to claim 13, wherein the non-volatile memory device further comprises a second array of memory cells, arranged in rows and coupled to second word lines, each of which corresponds to a corresponding first word line;
wherein the row decoder further comprises an additional pull-down stage, which is configured so as to carry out, for each second word line, operations of:
coupling the second word line to the node at reference potential, in a step of selection of the second word line; and
decoupling the second word line from the node at reference potential, in a step of deselection of the second word line; and wherein the pull-up stage further comprises, for each second word line, a corresponding second pull-up switch circuit, which is controlled via the corresponding control signal so as to, alternatively:
couple the second word line to the supply node, in the step of deselection of the second word line; and
decouple the second word line from the supply node, in the step of selection of the second word line.

17. The electronic apparatus according to claim 16, wherein the pull-up stage is interposed between the first and second arrays.

18. The electronic apparatus according to claim 11, wherein each control circuit further comprises a respective inverter circuit, interposed between the respective internal node and the corresponding first pull-up switch circuit.

19. The electronic apparatus according to claim 11, wherein each memory cell comprises a respective selector and a phase-change element.

20. The electronic apparatus according to claim 19, wherein the respective selector comprises a bipolar transistor.

* * * * *